United States Patent
Cheng et al.

(10) Patent No.: US 12,032,751 B2
(45) Date of Patent: Jul. 9, 2024

(54) KEY CONTROL DEVICE AND KEY CONTROL METHOD

(71) Applicant: BOE TECHNOLOGY GROUP CO., LTD., Beijing (CN)

(72) Inventors: Xinyi Cheng, Beijing (CN); Zhimao Wang, Beijing (CN); Liang Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 221 days.

(21) Appl. No.: 17/641,131

(22) PCT Filed: Feb. 26, 2021

(86) PCT No.: PCT/CN2021/078165
§ 371 (c)(1),
(2) Date: Mar. 8, 2022

(87) PCT Pub. No.: WO2022/178835
PCT Pub. Date: Sep. 1, 2022

(65) Prior Publication Data
US 2023/0152905 A1    May 18, 2023

(51) Int. Cl.
*H03M 1/22* (2006.01)
*G01P 13/04* (2006.01)
*G06F 3/023* (2006.01)
*H03M 1/30* (2006.01)

(52) U.S. Cl.
CPC .............. *G06F 3/023* (2013.01); *G01P 13/04* (2013.01); *H03M 1/303* (2013.01); *H03M 1/305* (2013.01)

(58) Field of Classification Search
CPC ...... H03M 1/305; H03M 1/303; H03M 1/306; H03M 1/00; H04L 27/22; B21D 5/004;
(Continued)

(56) References Cited

U.S. PATENT DOCUMENTS 4,266,215 A * 5/1981 Adams ................. H03M 1/305
341/11
5,525,885 A * 6/1996 Sato ..................... G01D 5/2449
318/632
(Continued)

FOREIGN PATENT DOCUMENTS

CN    101266284 A    9/2008
CN    202110438 U    1/2012
(Continued)

OTHER PUBLICATIONS

Chen, Li "Research and development of ventilator software based on customized android platform", Mar. 15, 2017. Master's Thesis, Southeast University, Nanjing, Jiangsu, China.

*Primary Examiner* — Linh V Nguyen
(74) *Attorney, Agent, or Firm* — HOUTTEMAN LAW LLC

(57) ABSTRACT

A key control device and a key control method are disclosed. The key control device includes: an encoder circuit including a first output terminal and a second output terminal and configured to output a first voltage signal and a second voltage signal through the first output terminal and the second output terminal respectively, under triggering of a rotational operation; a first interface extension circuit configured to receive the first voltage signal and the second voltage signal, and generate an interrupt signal and voltage state transition data in response to the first voltage signal or the second voltage signal output by the encoder circuit; and a main control circuit configured to determine a rotation direction of the rotation operation according to the interrupt signal and the voltage state transition data.

12 Claims, 7 Drawing Sheets

(58) Field of Classification Search
CPC .......... B21D 5/006; B21D 5/02; B25J 13/088;
B25J 9/126; B25J 9/1653; B25J 9/1664;
B25J 9/1674; G01D 18/001; G01D
2205/85; G01D 5/24457; G01D 5/24476;
G01D 5/2449; G01D 5/2454; G01D
5/366; G01F 1/08; G01F 1/12; G01F
25/10; G01J 2001/4242; G01J 2003/1217;
G01J 3/02; G01J 3/0202; G01J 3/0208;
G01J 3/021; G01J 3/0216; G01J 3/0218;
G01J 3/0229; G01J 3/027; G01J 3/0289;
G01J 3/06; G01J 3/1804; G01J 3/2846;
G01J 3/42; G01P 3/481
USPC .................... 341/5, 6, 11, 17, 35, 22, 23, 13
See application file for complete search history.

(56) References Cited

U.S. PATENT DOCUMENTS

| | | | |
|---|---|---|---|
| 5,647,003 A * | 7/1997 | Pease | G06K 1/125 380/59 |
| 5,856,792 A * | 1/1999 | Stevens | H03G 1/02 338/334 |
| 6,304,079 B1 * | 10/2001 | Kenjo | G01D 5/145 324/207.21 |
| 7,312,437 B2 * | 12/2007 | Hane | G01D 5/366 250/237 G |
| 2004/0021078 A1 * | 2/2004 | Hagler | G01J 3/06 250/339.13 |
| 2009/0140682 A1 * | 6/2009 | Watahiki | G03G 15/1615 399/361 |
| 2020/0125049 A1 * | 4/2020 | Kobayashi | G01D 5/2454 |
| 2022/0241973 A1 * | 8/2022 | Yamada | B25J 13/088 |

FOREIGN PATENT DOCUMENTS

| | | |
|---|---|---|
| CN | 105978576 A | 9/2016 |
| CN | 107656093 A | 2/2018 |
| CN | 207009326 U | 2/2018 |
| CN | 209497533 U | 10/2019 |
| CN | 112000141 A | 11/2020 |

\* cited by examiner

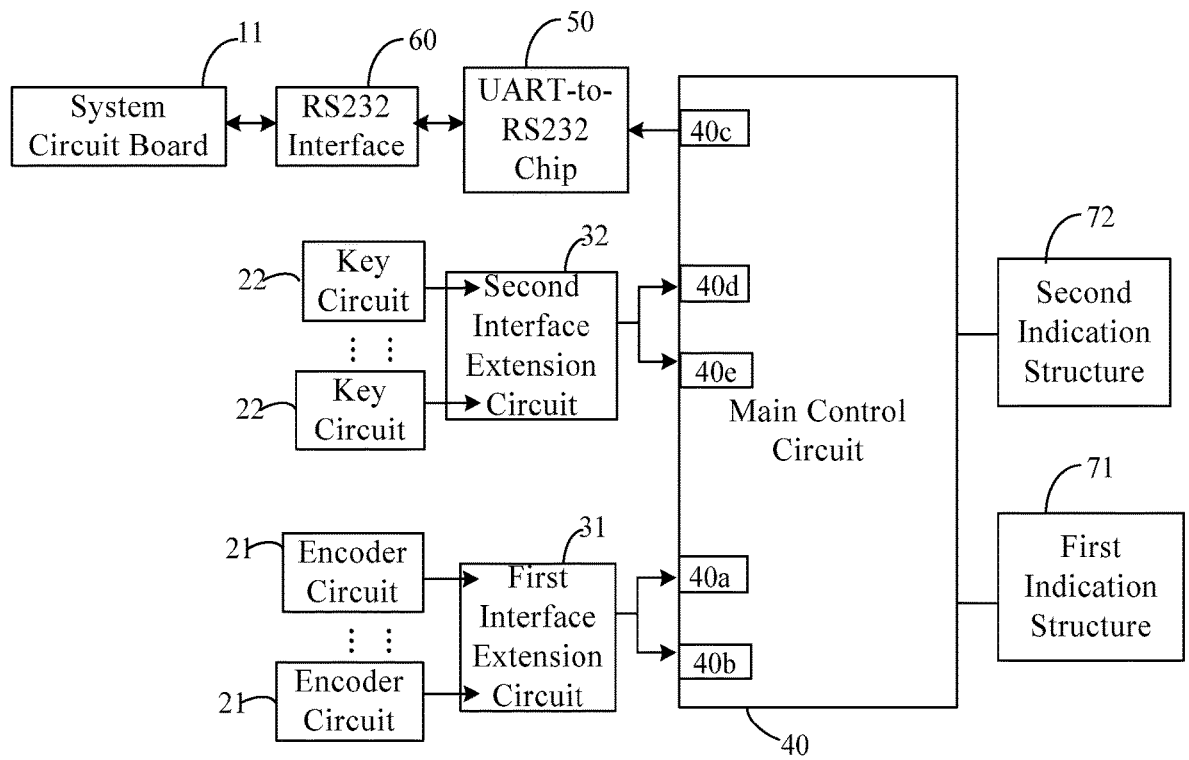

FIG.9

| First status register generates and stores voltage state transition data for first output terminal and second output terminal of encoder circuit according to output signal of each encoder circuit; and outputs interrupt signal through interrupt terminal of first interface extension circuit, when voltage state of any one of first output terminals or any one of second output terminals jumps | S11 |

↓

| Main control circuit determines number and rotation direction of encoder circuit triggered by rotation operation at least according to voltage state transition data stored in first status register, when interrupt signal output by first interface extension circuit is received | S12 |

FIG.10

KEY CONTROL DEVICE AND KEY CONTROL METHOD

TECHNICAL FIELD

The present disclosure relates to the field of display technology, in particular to a key control device and a key control method.

BACKGROUND

In a display system, a key circuit board is coupled to a system circuit board. After a key on the key circuit board is pressed, the system circuit board generates a corresponding control command to control a display to perform a corresponding operation.

SUMMARY

The present disclosure provides a key control device and a key control method.

The present disclosure provides a key control device including: an encoder circuit including a first output terminal and a second output terminal and configured to output a first voltage signal and a second voltage signal through the first output terminal and the second output terminal respectively, under triggering of a rotational operation; a first interface extension circuit configured to receive the first voltage signal and the second voltage signal, and generate an interrupt signal and voltage state transition data in response to the first voltage signal or the second voltage signal output by the encoder circuit; and a main control circuit configured to determine a rotation direction of the rotation operation according to the interrupt signal and the voltage state transition data.

In some embodiments, the first interface extension circuit includes a first status register configured to generate and store the voltage state transition data for the first output terminal and the second output terminal of the encoder circuit based on the first voltage signal and/or the second voltage signal.

In some embodiments, the main control circuit is configured to read out the voltage state transition data stored in the first status register in response to the interrupt signal output from the first interface extension circuit, and to determine the rotation direction of the rotation operation based on at least the voltage state transition data stored in the first status register.

In some embodiments, the first status register includes a first sub-register and a second sub-register.

The first sub-register is configured to generate and store the voltage state transition data for the first output terminal of the encoder circuit according to the first voltage signal output by the first output terminal; and the first interface extension circuit is configured to output a first type of interrupt signal when a transition of a voltage state occurs at the first output terminal.

The second sub-register is configured to generate and store the voltage state transition data for the second output terminal of the encoder circuit according to the second voltage signal output by the second output terminal; and the first interface extension circuit is configured to output a second type of interrupt signal when a transition of a voltage state occurs at the second output terminal.

In some embodiments, the first interface extension circuit includes: a first interrupt terminal and a second interrupt terminal, the first type of interrupt signal is an interrupt signal output by the first interrupt terminal, and the second type of interrupt signal is an interrupt signal output by the second interrupt terminal.

In some embodiments, the first interface extension circuit further includes a voltage level register configured to acquire voltage states for the first output terminal and the second output terminal of each of the encoder circuit in real time.

Determining the rotation direction of the rotation operation based on at least the voltage state transition data stored in the first status register includes: determining whether the voltage states for the first output terminal and the second output terminal of the encoder circuit triggered by the rotation operation are the same according to the voltage states acquired by the voltage level register; determining whether the interrupt signal is the first type of interrupt signal or the second type of interrupt signal, in response to the voltage states for the first output terminal and the second output terminal of the encoder circuit triggered by the rotation operation are not the same; and determining that the rotation direction is clockwise in response to that the interrupt signal is the first type of interrupt signal, and determining that the rotation direction is counterclockwise in response to that the interrupt signal is the second type of interrupt signal.

In some embodiments, the main control circuit is configured to: wait for an interrupt signal output by the first interface extension circuit for an $(i+1)^{th}$ time when the main control circuit receives an interrupt signal output by the first interface extension circuit for an $i^{th}$ time, and determine the rotation direction, according to the voltage state transition data for the first output terminal and the second output terminal when the first interface extension circuit outputs the interrupt signals for the $i^{th}$ time and for the $(i+1)^{th}$ time; wherein i is an odd number.

In some embodiments, the key control device includes a plurality of encoder circuits. The main control circuit is further configured to determine a number of an encoder circuit triggered by the rotation operation based on the interrupt signal and the voltage state transition data.

In some embodiments, the key control device further includes: a plurality of key circuits each of which is configured to output a signal with a third voltage level when the key circuit is triggered; otherwise, to output a signal with a fourth voltage level; and a second interface extension circuit including a second status register configured to generate and store triggering state data for each of the plurality of key circuits according to the signal output by the key circuit. The second interface extension circuit is configured to output an interrupt signal through an interrupt terminal of the second interface extension circuit when any one of the plurality of key circuits is triggered.

The main control circuit is further configured to determine a number of the triggered key circuit according to the triggering state data for each of the plurality of key circuits stored in the second status register when the second interface extension circuit outputs the interrupt signal.

An embodiment of the present disclosure provides a key control method for a key control device. The key control device includes a first interface extension circuit, a main control circuit and an encoder circuit, and the encoder circuit including a first output terminal and a second output terminal and configured to output a first voltage signal and a second voltage signal through the first output terminal and the second output terminal under triggering of a rotation operation.

The key control method includes: receiving, by the first interface extension circuit, the first voltage signal and the second voltage signal, and generating, by the first interface extension circuit, an interrupt signal and voltage state transition data in response to the first voltage signal or the second voltage signal output by the encoder circuit, and determining, by the main control circuit, a rotation direction of the rotation operation according to the interrupt signal and the voltage state transition data.

In some embodiments, the first interface extension circuit includes a first status register.

Generating, by the first interface extension circuit, the voltage state transition data, includes: generating and storing, by the first status register, the voltage state transition data for the first output terminal and the second output terminal of the encoder circuit based on the first voltage signal and/or the second voltage signal.

In some embodiments, determining, by the main control circuit, the rotation direction of the rotation operation according to the interrupt signal and the voltage state transition data includes: reading out, by the main control circuit, the voltage state transition data stored in the first status register in response to the interrupt signal output from the first interface extension circuit, and determining the rotation direction of the rotation operation based on at least the voltage state transition data stored in the first status register.

In some embodiments, generating and storing, by the first status register, the voltage state transition data for the first output terminal and the second output terminal of the encoder circuit based on the first voltage signal and/or the second voltage signal, includes: generating and storing, by the first sub-register, the voltage state transition data for each of the first output terminal of the encoder circuit according to the first voltage signal output by the first output terminal, and generating and storing, by the second sub-register, the voltage state transition data for each of the second output terminal of the encoder circuit according to the second voltage signal output by the second output terminal.

The first interface extension circuit outputs a first type of interrupt signal when a transition of a voltage state occurs at any one of the first output terminal; and the first interface extension circuit outputs a second type of interrupt signal when a transition of a voltage state occurs at any one of the second output terminal.

In some embodiments, the first interface extension circuit includes a first interrupt terminal and a second interrupt terminal, the first type of interrupt signal is an interrupt signal output by the first interrupt terminal, and the second type of interrupt signal is an interrupt signal output by the second interrupt terminal.

In some embodiments, the first interface extension circuit further includes a voltage level register.

The key control method further includes: acquiring, by the voltage level register, the voltage states for the first output terminal and the second output terminal of the encoder circuit in real time.

Determining the rotation direction of the rotation operation based on at least the voltage state transition data stored in the first status register, includes: determining whether the voltage states for the first output terminal and the second output terminal of the encoder circuit triggered by the rotation operation are the same according to the voltage states acquired by the voltage level register; determining whether the interrupt signal is the first type of interrupt signal or the second type of interrupt signal in response to that the voltage states for the first output terminal and the second output terminal of the encoder circuit triggered by the rotation operation are not the same; and determining that the rotation direction is clockwise in response to that the interrupt signal is the first type of interrupt signal, and determining that the rotation direction is counterclockwise in response to that the interrupt signal is the second type of interrupt signal.

In some embodiments, reading out, by the main control circuit, the voltage state transition data stored in the first status register in response to the interrupt signal output from the first interface extension circuit, and determining the rotation direction of the rotation operation based on at least the voltage state transition data stored in the first status register, includes: waiting for an interrupt signal output by the first interface extension circuit for an $(i+1)^{th}$ time when the main control circuit receives an interrupt signal output by the first interface extension circuit for an $i^{th}$ time; and determining the rotation direction, according to the voltage state transition data for each of the first output terminal and second output terminal when the first interface extension circuit outputs the interrupt signals for the $i^{th}$ time and for the $(i+1)^{th}$ time; wherein i is an odd number.

In some embodiments, the key control device includes a plurality of encoder circuits.

The key control method further includes: determining, by the main control circuit, a number of an encoder circuit triggered by the rotation operation based on the interrupt signal and the voltage state transition data.

In some embodiments, the key control device further includes: a second interface extension circuit having a second status register and a plurality of key circuits each of which is configured to output a signal with a third voltage level when the key circuit is triggered; otherwise, to output a signal with a fourth voltage level.

The key control method further includes: generating and storing, by the second status register, triggering state data for each of the plurality of key circuits according to the signal output by the key circuit, outputting an interrupt signal through an interrupt terminal of the second interface extension circuit when any one of the plurality of key circuits is triggered, and determining a number of the triggered key circuit according to the triggering state data for each of the plurality of key circuits stored in the second status register when the main control circuit receives the interrupt signal output by the second interface extension circuit.

BRIEF DESCRIPTION OF DRAWINGS

The accompanying drawings, which facilitate a further understanding of the present disclosure and constitute a part of the specification, are used in conjunction with the following specific embodiments to explain the present disclosure, but are not intended to limit the present disclosure. In the drawings:

FIG. 9 is a schematic diagram showing an electronic device provided in some embodiments of the present disclosure.

FIG. 10 is a flowchart showing a key control method provided in some embodiments of the present disclosure.

DETAIL DESCRIPTION OF EMBODIMENTS

The embodiments of the present disclosure will be described in detail below with reference to the accompanying drawings. It is to be understood that the embodiments described herein are merely used for describing and explaining the present disclosure, rather than limiting the present disclosure.

Figure 1:
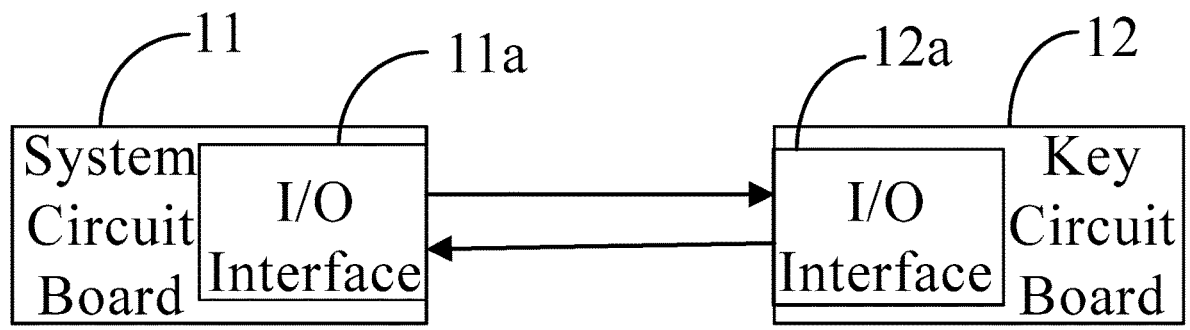
FIG. 1 is a schematic diagram showing a connection between a system circuit board and a key control device of a display device according to an embodiment.

FIG. 1 is a schematic diagram showing a connection between a system circuit board and a key control device of a display device according to an embodiment. As shown in FIG. 1, in the display device, the system circuit board 11 is coupled to the key control device 12, and an I/O (input/output) interface 12a of the key control device 12 is coupled to an I/O interface 11a of the system circuit board 11 through a connector. When a key on the key control device 12 is triggered/pressed to operate, a microcontroller (micro-controller unit, MCU) of the key control device 12 determines a type of the input command (e.g., which key is triggered/pressed); and the system circuit board 11 performs a corresponding operation. For example, the system circuit board 11 transmits a corresponding control command to a display according to a judgment result of the microcontroller.

In some display devices (e.g., monitors), the key control device 12 not only needs to be provided with touch keys or mechanical (press type) keys as command input devices, but also needs to be provided with a plurality of rotary encoders as the command input devices. In such an application scenario, when a certain rotary encoder performs a rotation operation, the microcontroller determines not only which rotary encoder performs the rotation operation, but also the direction of the rotation operation. It is difficult for the microcontroller to provide sufficient I/O interfaces, and in turn it is difficult for the microcontroller to determine the type of the input command.

Figure 2:
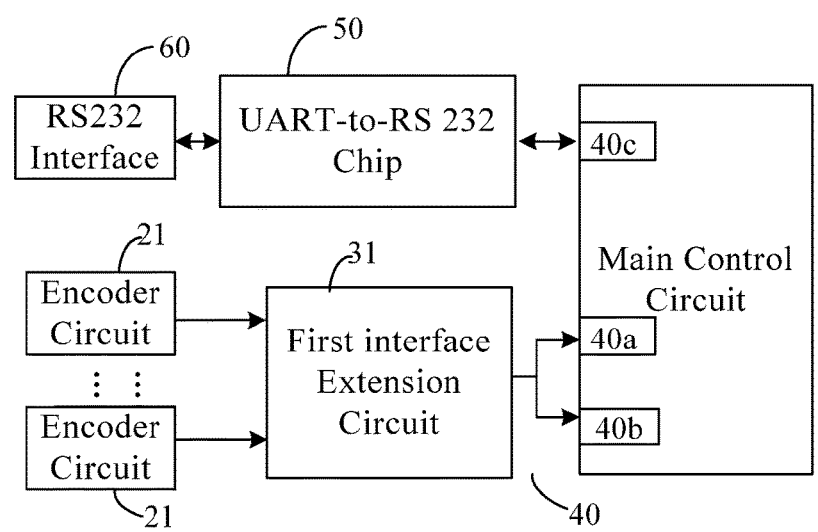
FIG. 2 is a circuit schematic diagram showing a key control device in some embodiments of the present disclosure.

FIG. 2 is a schematic circuit diagram showing a key control device provided in some embodiments of the present disclosure. As shown in FIG. 2, the key control device includes a first interface extension circuit 31, a main control circuit 40, and an encoder circuit 21. The key control device may include only one encoder circuit, or may include a plurality of encoder circuits.

Figure 3:
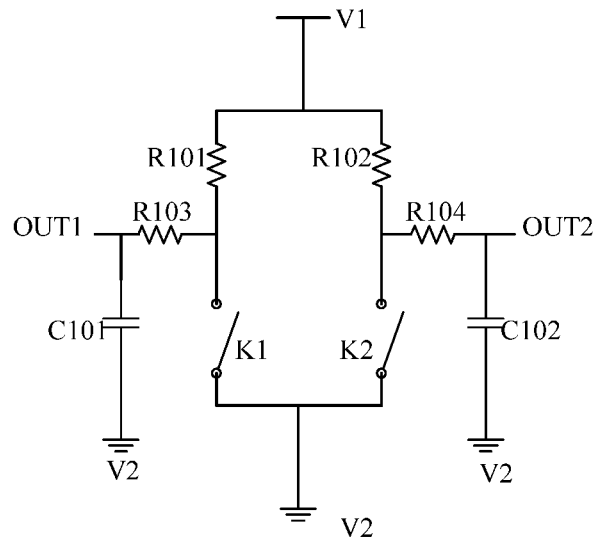
FIG. 3 is a schematic diagram showing an encoder circuit in some embodiments of the present disclosure.

FIG. 3 is a schematic diagram showing an encoder circuit provided in some embodiments of the present disclosure. As shown in FIG. 3, each encoder circuit 21 has a first output terminal OUT1 and a second output terminal OUT2. The encoder circuit 21 is configured to: output a first voltage signal through the first output terminal OUT1 and output a second voltage signal through the second output terminal OUT2 under triggering of a rotation operation. It should be noted that the first voltage signal and the second voltage signal are signals output from the first output terminal OUT1 and the second output terminal OUT2, respectively. Each of the first voltage signal and the second voltage signal has two voltage states, and the voltage states refer to high and low voltage states of the first voltage signal or the second voltage signal. Hereinafter, the voltage states of the first output terminal OUT1 are the voltage states of the first voltage signal, and the voltage states of the second output terminal OUT2 are the voltage states of the second voltage signal. For example, under the triggering of the rotation operation, each of the first voltage signal and the second voltage signal switches (jumps) between the first voltage state and the second voltage state. That is, each of the first output terminal OUT1 and the second output terminal OUT2 switches between the first voltage state and the second voltage state. When the rotation direction is clockwise, the first voltage signal switches before the switching of the second voltage signal; when the rotation direction is counterclockwise, the second voltage signal switches before the switching of the first voltage signal. The first voltage state is a low level state, and the second voltage state is a high level state; alternatively, the first voltage state is a high level state, and the second voltage state is a low level state. Taking the first voltage state as a low level state and the second voltage state as a high level state as an example, when the first voltage signal is in the first voltage state, the voltage value of the first voltage signal is v11; when the first voltage signal is in the second voltage state, the voltage value of the first voltage signal is v12; when the second voltage signal is in the first voltage state, the voltage value of the second voltage signal is v21; when the second voltage signal is in the second voltage state, the voltage value of the second voltage signal is v22, wherein v11<v12, v21<v22. Values v11 and v21 may be equal to each other or may not be equal to each other; and values v12 and v22 may be equal to each other or may not be equal to each other.

The encoder circuit 21 includes a first pull-up resistor R101, a second pull-up resistor R102, a first switch K1, a second switch K2, a first filter resistor R103, a first filter capacitor C101, a second filter resistor R104 and a second filter capacitor C102. A first terminal of the first pull-up resistor R101 is coupled to a first power terminal V1 which is a high-level voltage terminal; and a second terminal of the first pull-up resistor R101 is coupled to the first switch K1. The two terminals of the first switch K1 are respectively coupled to the second terminal of the first pull-up resistor R101 and a second power terminal V2 which is a low-level signal terminal, for example, a ground terminal. The first filter resistor R103 and the first filter capacitor C101 constitute a first filter circuit. Two terminals of the first filter resistor R103 are respectively coupled to the second terminal of the first pull-up resistor R101 and the first output terminal OUT1 of the encoder circuit 21. Both terminals of the first filter capacitor C101 are coupled to the first output terminal OUT1 of the encoder circuit 21 and the second power terminal V2, respectively. A first terminal of the second pull-up resistor R102 is coupled to the first power terminal V1, and a second terminal of the second pull-up resistor R102 is coupled to the second switch K2. Both terminals of the second switch K2 are coupled to the second terminal of the second pull-up resistor R102 and the second power terminal V2, respectively. The second pull-up resistor and the second filter resistor R104 constitute a second filter circuit. Two terminals of the second filter resistor R104 are respectively coupled to the second terminal of the second pull-up resistor R102 and the second output terminal OUT2 of the encoder circuit 21. The second filter capacitor C102 has two terminals coupled to the second output terminal OUT2 of the encoder circuit 21 and the second power terminal V2, respectively.

The on-off state (including a turn-off state and a turn-on state) of the first switch K1 or the second switch K2 is switched from one to the other under the triggering of the rotation operation. When the rotation direction is clockwise, the on-off state of the first switch K1 is switched from one to the other before the switching of the on-off state of the second switch K2; when the rotation direction is counter-clockwise, the on-off state of the second switch K2 is switched from one to the other prior to switching of the on-off state of the first switch K1.

Optionally, the resistance value of the first pull-up resistor R101 is the same as the resistance value of the second pull-up resistor R102, the resistance value of the first filter resistor R103 is the same as the resistance value of the second filter resistor R104, and the capacitance value of the first filter capacitor C101 is the same as the capacitance value of the second filter capacitor C102. When each of the first switch K1 and the second switch K2 is turned on (closed), the output signals of the first output terminal OUT1 and the second output terminal OUT2 are both in the first voltage state, and the voltages of the output signals of the first output terminal OUT1 and the second output terminal OUT2 are the same to each other. When both the first switch K1 and the second switch K2 are turned off (open), the output signals of the first output terminal OUT1 and the second output terminal OUT2 are both in the second voltage state, and the voltages of the output signals of the first output terminal OUT1 and the second output terminal OUT2 are the same to each other.

For example, in the initial state, the first switch K1 and the second switch K2 are both in the turn-off state. When the rotation operation is performed for the first time and the rotation direction is clockwise, the first switch K1 is firstly switched to the turn-on state, and then the second switch K2 is switched to the turn-on state. When the rotation operation is performed for the first time and the rotation direction is counterclockwise, the second switch K2 is firstly switched to the turn-on state, and then the first switch K1 is switched to the turn-on state. When the rotation operation is performed for the second time and the rotation direction is clockwise, the first switch K1 is firstly switched to the turn-off state, and then the second switch K2 is switched to the turn-off state. When the rotation operation is performed for the second time and the rotation direction is counterclockwise, the second switch K2 is firstly switched to the turn-off state, and then the first switch K1 is switched to the turn-off state.

The "turn-off state" of the switch refers to that two terminals of the switch are electrically disconnected from each other; and the "turn-on state" of the switch refers to that the two terminal of the switch are electrically connected to each other.

It should be noted that the first switch K1 and the second switch K2 may be disposed inside the rotary encoder. When the rotary encoder rotates by a preset angle, each of the first switch K1 and the second switch K2 switches between the turn-on state and the turn-off state once. When the rotary encoder rotates by a larger angle (e.g., the rotary encoder rotates by a full circle), each of the first switch K1 and the second switch K2 continuously switches between the turn-on state and the turn-off state for multiple times. The "rotation operation" in the embodiment of the present disclosure is for one rotation operation, that is, each of the first switch K1 and the second switch K2 switches between the turn-on state and the turn-off state once.

In some embodiments, the first output terminals OUT1 and the second output terminals OUT2 of all the encoder circuits 21 are coupled to the input interfaces of the first interface extension circuit 31. Each first output terminal OUT1 is coupled to one of the input interfaces, and each second output terminal OUT2 is coupled to one of the input interfaces. Different first output terminals OUT1 are coupled to corresponding input interfaces, and different second output terminals OUT2 are coupled to corresponding input interfaces. The input interface is, for example, a General-purpose input/output (GPIO) interface.

The first interface extension circuit 31 is configured to receive the first voltage signal and the second voltage signal output from the encoder circuit 21, and generate an interrupt signal and a voltage state transition (jump) data in response to the first voltage signal or the second voltage signal output from the encoder circuit 21.

Figure 4:
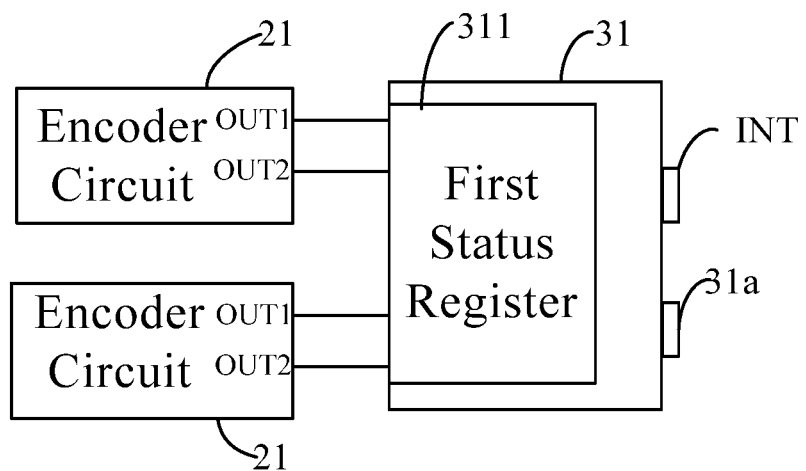
FIG. 4 is a schematic diagram showing a connection between a first interface extension circuit and an encoder circuit provided in some embodiments of the present disclosure.

FIG. 4 is a schematic diagram showing a connection between the first interface extension circuit and the encoder circuit provided in some embodiments of the present disclosure. The number of the encoder circuits 21 in FIG. 4 is only an example. In some embodiments, as shown in FIG. 4, the first interface extension circuit 31 includes a first status (state) register 311. The first status register 311 is configured to generate and store the voltage state transition data for the first output terminal OUT1 and the second output terminal OUT2 of the encoder circuit 21 according to the first voltage signal and/or the second voltage signal output by the encoder circuit 21. When a transition of a voltage state occurs at any one of the first output terminals OUT1 or any one of the second output terminals OUT2, the first status register 311 transmits an interrupt signal to an interrupt terminal INT of the first interface extension circuit 31, so that the interrupt signal is output through the interrupt terminal INT of the first interface extension circuit 31. The first status register 311 has an interrupt sending terminal. The interrupt sending terminal of the first status register 311 is coupled to the interrupt terminal INT.

The so-called "voltage state transition data" refers to the data indicating whether the voltage state is jumped/switched or not. For example, the digital signal "1" indicates that the voltage state is jumped/switched, and the digital signal "0" indicates that the voltage state is not jumped/switched. In one example, the first interface extension circuit 31 has interfaces I_0, I_1, I_2, I_3, I_4, I_5, I_6, and I_7 as the input interfaces. A first output terminal OUT1 of a $1^{st}$ encoder circuit 21 is coupled to the interface I_0, and a second output terminal OUT2 of the $1^{st}$ encoder circuit 21 is coupled to the interface I_1. A first output terminal OUT1 of the 2nd encoder circuit 21 is coupled to the interface I_2, and the second output terminal OUT2 of the $2^{nd}$ encoder circuit 21 is coupled to the interface I_3. A first output terminal OUT1 of a $3^{rd}$ encoder circuit 21 is coupled to the interface I_4, and a second output terminal OUT2 of the $3^{rd}$ encoder circuit 21 is coupled to the interface I_5. A first output terminal OUT1 of a $4^{th}$ encoder circuit 21 is coupled to the interface I_6, and a second output OUT2 of the $4^{th}$ encoder circuit 21 is coupled to the interface I_7, respectively. When no transition of a voltage state occurs at each of the first output terminals OUT1 and the second output terminals OUT2, the data stored in the first status register 311 is "00000000"; when a transition of a voltage state occurs at the first output terminal OUT1 of the 1$^{st}$ encoder, the data stored in the first status register 311 is updated to "00000001"; when a transition of a voltage state occurs at the second output terminal OUT2 of the 1$^{st}$ encoder, the data stored in the first status register 311 is updated to "00000010".

The main control circuit 40 is configured to determine the direction of the rotation operation based on the interrupt signal and the voltage state transition data.

In some embodiments, the main control circuit reads out the voltage state transition data stored in the first status register 311 in response to the interrupt signal output by the first interface extension circuit 31; and determines the rotation direction of the rotation operation according to at least the voltage state transition data stored in the first status register 311.

For example, the main control circuit 40 includes a microcontroller, which specifically employs MCP 23017. The main control circuit 40 further includes a first interrupt receiving interface 40a and a first signal reading interface 40b. The first interrupt receiving interface 40a is coupled to the interrupt terminal INT of the first interface extension circuit 31 and is configured to receive the interrupt signal output from the first interface extension circuit 31. The first signal reading interface 40b is coupled to a data terminal 31a of the first interface extension circuit 31 and configured to read out the voltage state transition data of each of the first output terminal OUT1 and the second output terminal OUT2 stored in the first status register 311. For example, the first signal reading interface may employ an I$^2$C interface, and the first interrupt receiving interface 40a may employ a GPIO interface.

It should be noted that, after the main control circuit 40 reads out the voltage state transition data stored in the first status register 311, the first status register 311 resets the voltage state transition data stored therein, so that each voltage state transition data is reset to an initial value which indicates that the voltage state does not jump. For example, when no transition of a voltage state occurs at each of the first output terminals OUT1 and the second output terminals OUT2, the data stored in the first status register 311 is "00000000". When a transition of a voltage state occurs at the first output terminal OUT1 of the 1$^{st}$ encoder circuit 21, the data stored in the first status register 311 is updated to "00000001". When a transition of a voltage state occurs at the second output terminal OUT2 of the 1$^{st}$ encoder circuit 21, the data stored in the first status register 311 is updated to "00000010". In this case, after the main control circuit 40 reads out data from the first status register 311 once, the data stored in the first status register 311 is reset to "00000000".

The main control circuit 40 may further include a transmission interface 40c. The main control circuit 40 outputs an operation control command to the system circuit board of the display device according to the determined result (e.g., a number and the rotation direction of the rotary encoder triggered by the rotation operation). The system circuit board performs a corresponding operation according to the operation control command output from the main control circuit 40. For example, the system circuit board controls the display to display a corresponding image. The transmission interface 40c may be an UART interface, which is coupled to an RS232 interface 60 of the key circuit board via a UART-to-RS232 chip 50, and the RS232 interface 60 of the key circuit board is coupled to the RS232 interface of the system circuit board.

In the embodiment of the present disclosure, when the encoder circuit 21 is triggered by the rotation operation, a transition of a voltage state occurs at each of the first output terminal OUT1 and the second output terminal OUT2 of the encoder circuit 21. If the rotation directions are different, a timing of the transition of the voltage state at the first output terminal OUT1 is different from a timing of the transition of the voltage state at the second output terminal OUT2. The first status register 311 may store the voltage state transition data for the first output terminal OUT1 and the second output terminal OUT2. The first interface extension circuit 31 outputs the interrupt signal when a transition of a voltage state occurs at any one of the first output terminals OUT1 and any one of the second output terminals OUT2. When the main control circuit 40 receives the interrupt signal, the main control circuit 40 determines the rotation direction of the rotation operation according to the interrupt signal and the voltage state transition data, and then determines the input command received by the key control device.

In the embodiment of the present disclosure, in the case of a plurality of encoder circuits 21, the main control circuit 40 is further configured to determine the number of the encoder circuit 21 triggered by the rotation operation according to the interrupt signal and the voltage state transition data. For example, when the first interface extension circuit 31 outputs an interrupt signal, the main control circuit 40 determines the number of the encoder circuit 21 triggered by the rotation operation at least according to the voltage state transition data for each first output terminal OUT 1 and each second output terminal OUT2 stored in the first status register 311.

The following embodiment in which a plurality of encoder circuits 21 are provided is illustrated.

In some embodiments, the main control circuit 40 determines the number of the rotary encoder triggered by the rotation operation and the rotation direction of the rotation operation by means of method I below.

Method I includes: waiting for, by the main control circuit, the interrupt signal output by the first interface extension circuit 31 for the (i+1)th time when the main control circuit 40 receives the interrupt signal output by the first interface extension circuit 31 for the i$^{th}$ time; determining the number of the encoder circuit 21 triggered by the rotation operation, according to the voltage state transition data for each of the first output terminals OUT1 and the second output terminals OUT2 when the first interface extension circuit 31 outputs the interrupt signals for the i$^{th}$ time and for the (i+1)$^{th}$ time; and determining the rotation direction, according to the voltage state transition data for the first output terminal OUT1 and the second output terminal OUT2 when the first interface extension circuit 31 outputs the interrupt signals for the i$^{th}$ time and for the (i+1)$^{th}$ time. For example, a transition timing of the voltage states of the first output terminal OUT1 and the second output terminal OUT2 is determined according to the voltage transition data for the first output terminal OUT 1 and the second output terminal OUT2 when the first interface extension circuit 31 outputs the interrupt signals for the i$^{th}$ time and for the (i$_+$1)$^{th}$ time; and the rotation direction is determined according to the transition timing of the voltage states of the first output terminal OUT1 and the second output terminal OUT2, wherein i is an odd number.

For example, when the main control circuit 40 receives the interrupt signal output by the first interface extension circuit 31 for the i$^{th}$ time, the main control circuit 40 reads out the voltage state transition data stored in the first status register 31, and determines that the transition of the voltage state occurs at the first output terminal OUT1 of the Pt encoder circuit 21; after that, the main control circuit 40 waits until the interrupt signal is output by the first interface extension circuit 31 again. When the main control circuit 40 receives the interrupt signal output by the first interface extension circuit 31 for the $(i+1)^{th}$ time, the main control circuit 40 reads out the voltage state transition data stored in the first status register 311, and determines that the transition of the voltage state occurs at the second output terminal OUT2 of the $1^{st}$ encoder circuit 21. In this case, the main control circuit 40 determines that the $1^{st}$ encoder circuit 21 is controlled by the rotation operation and the rotation direction is clockwise.

For another example, when the main control circuit 40 receives the interrupt signal output by the first interface extension circuit 31 for the $i^{th}$ time, the main control circuit 40 reads out the voltage state transition data stored in the first status register 311, and determines that the transition of the voltage state occurs at the second output terminal OUT2 of the $1^{st}$ encoder circuit 21; after that, the main control circuit 40 waits until the interrupt signal is output by the first interface extension circuit 31 again. When the main control circuit 40 receives the interrupt signal output by the first interface extension circuit 31 for the $(i+1)^{th}$ time, the main control circuit 40 reads out the voltage state transition data stored in the first status register 311, and determines that the transition of the voltage state occurs at the first output terminal OUT1 of the $1^{st}$ encoder circuit 21. In this case, the main control circuit 40 determines that the $1^{st}$ encoder circuit 21 is controlled by the rotation operation, and the rotation direction is counterclockwise.

Figure 5:
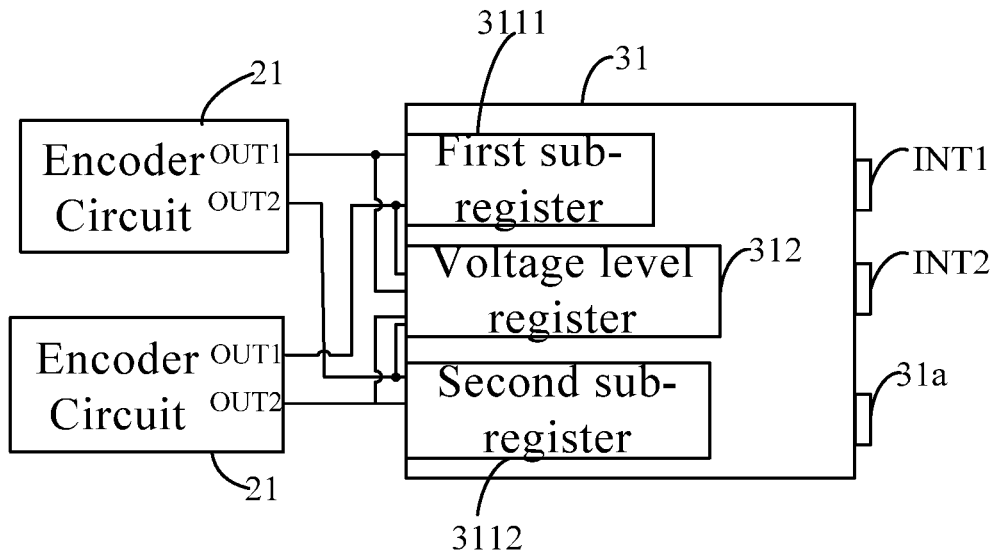
FIG. 5 is a schematic diagram showing a connection between a first interface extension circuit and an encoder circuit provided in further embodiments of the present disclosure.

FIG. 5 is a schematic diagram showing a connection between the first interface extension circuit and the encoder circuit provided in other embodiments of the present disclosure. The number of the encoder circuits 21 in FIG. 5 is only an example. As shown in FIG. 5, the first status register includes a first sub-register 3111 and a second sub-register 3112. The first sub-register 3111 is configured to generate and store voltage state transition data for the first output terminal OUT1 of the encoder circuit 21 according to the first voltage signal output by the first output terminal OUT1. The first interface extension circuit 31 outputs a first type of interrupt signal when the transition of the voltage state occurs at the first output terminal OUT1. The second sub-register 3112 is configured to generate and store the voltage state transition data for the second output terminal OUT2 of the encoder circuit 21 according to the second voltage signal output by the second output terminal OUT2. The first interface extension circuit 31 outputs a second type of interrupt signal when the transition of the voltage state occurs at the second output terminal OUT2. It should be noted that the first sub-register 3111 may generate and store the voltage state transition data for the first output terminal OUT1 of each encoder circuit 21 according to the output signal of the first output terminal OUT1, and provide the first type of interrupt signal to the interrupt terminal of the first interface extension circuit 31 for output by the first interface extension circuit 31 when the transition of the voltage state occurs at any one of the first output terminals OUT1. The second sub-register 3112 may generate and store the voltage state transition data for the second output terminal OUT2 of each encoder circuit 21 according to the output signal of the second output terminal OUT2, and provide the second type of interrupt signal to the interrupt terminal of the first interface extension circuit 31 for output by the first interface extension circuit 31 when the transition of the voltage state occurs at any one of the second output terminals OUT2.

It should be noted that the first sub-register 3111 and the second sub-register 3112 may be two independent registers, or may be integrated into one register.

The first interface extension circuit 31 further includes a voltage level register 312. In some embodiments, the voltage level register 312 is configured to obtain the voltage states for the first output terminal OUT1 and the second output terminal OUT2 of each encoder circuit 21. The voltage level register 312 may obtain the voltage state of each of the first output terminal OUT1 and the second output terminal OUT2 in real time.

In this case, for a certain rotary encoder, when the rotary encoder completes one clockwise rotation operation, the transition of the voltage state firstly occurs at the first output terminal OUT1, and then the transition of the voltage state occurs at the second output terminal OUT2. Accordingly, the first interface extension circuit 31 outputs the first type of interrupt signal firstly, and then outputs the second type of interrupt signal. After the transition of the voltage state occurs at the first output terminal OUT1 and before no transition of the voltage state occurs at second output terminal OUT2 (i.e., when the first type of interrupt signal is output and the second type of interrupt signal is not output), the voltage states for the first output terminal OUT1 and the second output terminal OUT2 are different from each other. When the transition of the voltage state completes at the second output terminal OUT2 (i.e., after the second type of interrupt signal is output), the voltage states for the first output terminal OUT1 and the second output terminal OUT2 are the same. When the rotary encoder completes one counterclockwise rotation operation, the transition of the voltage state occurs at the second output terminal OUT2 firstly, and then the transition of the voltage state occurs at the first output terminal OUT1. Accordingly, the first interface extension circuit 31 outputs the second type of interrupt signal firstly and then outputs the first type of interrupt signal. After the transition of the voltage state occurs at the second output terminal OUT2 and before no transition of the voltage state occurs at the first output terminal OUT1 (i.e., after the first interface extension circuit 31 outputs the second type of interrupt signal and does not output the first type of interrupt signal yet), the voltage states for the first output terminal OUT1 and the second output terminal OUT2 are different from each other. When the transition of the voltage state completes at the first output terminal OUT1 (i.e., after the first type of interrupt signal is output), the voltage states for the first output terminal OUT1 and the second output terminal OUT2 are the same. Therefore, the main control circuit 40 may determine the number of the encoder circuit 21 triggered by the rotation operation after receiving the interrupt signal output by the first interface extension circuit 31, and then determine the number of the encoder circuit 21 triggered by the rotation operation and the rotation direction of the rotation operation according to the type of the interrupt signal by determining whether the voltage states for the first output terminal OUT1 and the second output terminal OUT2 are the same or not.

Specifically, the number of the encoder circuits 21 triggered by the rotation operation and the rotation direction of the rotation operation may be determined according to method II.

Method II includes: determining the number of the encoder circuit 21 triggered by the rotation operation according to the voltage state transition data stored in the first status register 311; and determining whether the voltage states, obtained by the voltage level register 312, for the first output terminal OUT1 and the second output terminal OUT2 of the encoder circuit 21 triggered by the rotation operation, are the same or not; if not, determining whether the interrupt signal belongs to the first type or the second type of interrupt signal; if the interrupt signal belongs to the first type of interrupt signal, determining that the rotation direction is clockwise, and if the interrupt signal belongs to the second type of interrupt signal, determining that the rotation direction is counterclockwise.

In some embodiments, the first interface extension circuit 31 includes: a first interrupt terminal INT1 and a second interrupt terminal INT2. The first type of interrupt signal is an interrupt signal output from the first interrupt terminal; the second type of interrupt signal is an interrupt signal output from the second interrupt terminal. It should be noted that the first interface extension circuit 31 may include only one interrupt terminal, and in this case, the first type of interrupt signal and the second type of interrupt signal may be distinguished by other characteristics. For example, the first type of interrupt signal and the second type of interrupt signal may be signals with different voltages, respectively.

For example, when the $1^{st}$ rotary encoder rotates clockwise once, the transition of the voltage state occurs at the first output terminal OUT1, and then the transition of the voltage state occurs at the second output terminal OUT2 of the encoder circuit 21. The voltage level register 312 obtains the voltage states for the first output terminal OUT1 and the second output terminal OUT2 in real time. After the transition of the voltage state occurs at the first output terminal OUT1 and no transition of the voltage state occurs at the second output terminal OUT2, the first sub-register 3111 stores the voltage state transition data for the first output terminal OUT1, and the first sub-register 3111 provides the interrupt signal to the first interrupt terminal INT1, so that the interrupt signal is output through the first interrupt terminal INT1. When the main control circuit 40 receives the interrupt signal, the main control circuit 40 determines that the $1^{st}$ encoder circuit 21 is triggered by the rotation operation according to the voltage state transition data stored in the first sub-register 3111. In addition, the main control circuit 40 further reads out the voltage states for the first output terminal OUT1 and the second output terminal OUT2 obtained by the voltage level register 312, and determines that the voltage states for the first output terminal OUT1 and the second output terminal OUT2 of the $1^{st}$ encoder circuit 21 are different from each other through comparison between the voltage states for the first output terminal OUT1 and the second output terminal OUT2 (because the transition of the voltage state occurs at the first output terminal OUT1 of the $1^{st}$ encoder circuit 21, and no transition of the voltage state occurs at the second output terminal OUT2, the voltage states for the first output terminal OUT1 and the second output terminal OUT2 of the $1^{st}$ encoder circuit 21 obtained by the voltage level register 312 are different from each other). In this case, the main control circuit 40 determines that the interrupt signal comes from the first interrupt terminal INT1 of the $1^{st}$ encoder circuit 21, which indicates that the transition of the voltage state firstly occurs at the first output terminal OUT1 of the $1^{st}$ encoder circuit 21, and in turn determines that the rotary encoder corresponding to the $1^{st}$ encoder circuit 21 rotates clockwise. When the transition of the voltage state occurs at the second output terminal OUT2, the second sub-register 3112 outputs the interrupt signal. In this case, the voltage states for the first output terminal OUT1 and the second output terminal OUT2 obtained by the voltage level register 312 are the same.

After receiving the interrupt signal, the main control circuit 40 determines that the voltage states for the first output terminal OUT1 and the second output terminal OUT2 of the $1^{st}$ encoder circuit 21 are the same according to the voltage states obtained by the voltage level register 312, and in this case, the main control circuit 40 does not output the operation control command to the system circuit board.

For example, the input interfaces of the first interface extension circuit 31 include interfaces I_0, I_1, I_2, and I_3 respectively. A first output terminal OUT1 of a $1^{st}$ encoder circuit 21 is coupled to the interface I_0, and a second output terminal OUT2 of the $1^{st}$ encoder circuit 21 is coupled to the interface I_1. A first output terminal OUT1 of a $2^{nd}$ encoder circuit 21 is coupled to the interface I_2, and a second output terminal OUT2 of the $2^{nd}$ encoder circuit is coupled to the interface I_3. Each of the first output terminal OUT1 and the second output terminal OUT2 switches between a first voltage state and a second voltage state. When the first output terminal OUT1 is in the first voltage state, the first voltage signal output by the first output terminal OUT1 has a value of 0V. When the first output terminal OUT1 is in the second voltage state, the second voltage signal output by the first output terminal OUT1 has a value of 3V. When the second output terminal OUT2 is in the first voltage state, the second voltage signal output by the second output terminal OUT2 has a value of 0V. When the second output terminal OUT2 is in the second voltage state, the second voltage signal output by the second output terminal OUT1 has a value of 3V. At an initial time t0, the first voltage signal output by the first output terminal OUT1 of the $1^{st}$ encoder circuit 21 has a value of 0V, and the second voltage signal output by the second output terminal OUT2 has a value of 3V. The voltage state transition data stored in the first sub-register 3111 is "00", and the voltage state transition data stored in the second sub-register 3112 is "00". After time t0, the rotary encoder corresponding to the $1^{st}$ encoder circuit 21 rotates clockwise. Specifically, at time t1 after time t0, the first voltage signal output by the $1^{st}$ encoder circuit 21 switches from 0V to 3V, and at time t2 after time t1, the second voltage signal output by the $1^{st}$ encoder circuit 21 switches from 0V to 3V.

In this case, when the first voltage signal output from the $1^{st}$ encoder circuit 21 jumps to 3V and the time t2 has not yet arrived, the voltage state transition data stored in the first sub-register 3111 is updated to "01", and the first interrupt terminal INT1 outputs an interrupt signal. The voltage level register 312 acquires that the first output terminal OUT1 of the $1^{st}$ encoder circuit 21 is in the second voltage state and the second output terminal OUT2 of the $1^{st}$ encoder circuit 21 is in the first voltage state. After receiving the interrupt signal at time t1, the main control circuit 40 reads out the voltage state transition data stored in the first sub-register 3111, and determines that the $1^{st}$ encoder circuit 21 is triggered by the rotation operation. In addition, the main control circuit 40 reads out the voltage states for the first output terminal OUT1 and the second output terminal OUT2 obtained by the first voltage level register 312, and determines that the voltage states for the first output terminal OUT1 and the second output terminal OUT2 of the Pt encoder circuit 21 are different from each other. In addition, the main control circuit 40 determines that the interrupt signal comes from the first interrupt terminal INT1, and in turn determines that the rotary encoder corresponding to the $1^{st}$ encoder circuit 21 rotates clockwise. When the second voltage signal output from the $1^{st}$ encoder circuit 21 jumps to 3V at time t2, the voltage state transition data stored in the first sub-register 3111 is updated to "10", and the second interrupt terminal INT2 outputs an interrupt signal. The voltage level register 312 acquires that both the first output terminal OUT1 and the second output terminal OUT2 of the 1$^{st}$ encoder circuit 21 are in the second voltage state. After receiving the interrupt signal at time t2, the main control circuit 40 reads out the voltage state transition data stored in the first sub-register 3111, and determines that the 1$^{st}$ encoder circuit 21 is triggered by the rotation operation. In addition, the main control circuit 40 reads out the voltage states for the first output terminal OUT1 and the second output terminal OUT2 obtained by the first voltage level register 312, and determines that the voltage states for the first output terminal OUT1 and the second output terminal OUT2 of the 1$^{st}$ encoder circuit 21 are the same. In this case, the main control circuit 40 does not output the operation control command to the system circuit board.

As can be seen from the above examples, when the rotary encoder undergoes one rotation operation, that is, when the transition of the voltage state occurs at one of the first output terminal OUT1 and the second output terminal OUT2 firstly and no transition of the voltage state occurs at the other one, the main control circuit 40 may determine the rotation direction, thereby improving the speed for determination and further the accuracy for determination. As an example, the 1$^{st}$ rotary encoder continuously undergoes two clockwise rotations. When the transition of the voltage state occurs at the first output terminal OUT1 for the first time, the voltage state transition data generated by and stored in the first sub-register 3111 is not read by the main control circuit 40. When the transition of the voltage state occurs at the second output terminal OUT2 for the first time and the transition of the voltage state occurs at the first output terminal OUT1 for the second time, the voltage state transition data generated by and stored in the first sub-register 3111 is read by the main control circuit 40. When the transition of the voltage state occurs at the second output terminal OUT2 for the second time, the voltage state transition data generated by and stored in the second sub-register 3112 is not read by the main control circuit 40. In this case, when the transition of the voltage state occurs at the second output terminal OUT2 for the first time, the voltage states for the first output terminal OUT1 and the second output terminal OUT2 are the same (because a transition of a voltage state occurs at each of the first output terminal OUT1 and the second output terminal OUT2 once). When the transition of the voltage state occurs at the first output terminal OUT1 for the second time, the main control circuit 40 determines that the 1$^{st}$ rotary encoder completes one clockwise rotation. It can be seen that when the rotary encoder rotates fast and the data reading speed of the main control circuit 40 is low, the main control circuit 40 can ensure the accuracy of determination when determining the number and the rotation direction of the rotary encoder triggered by the rotation operation by the method II.

Figure 6:
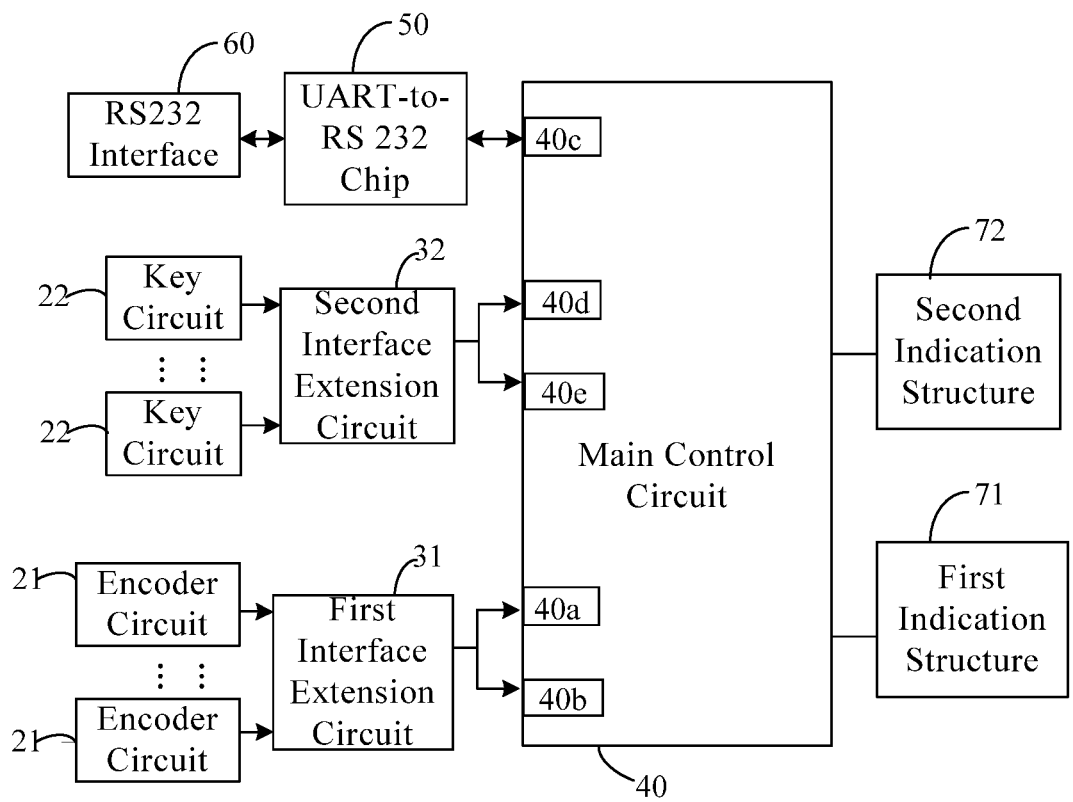
FIG. 6 is a circuit diagram showing a key control device provided another embodiment of the present disclosure.

FIG. 6 is a schematic circuit diagram showing a key control device provided in another embodiment of the present disclosure. Compared with FIG. 2, the key control device in FIG. 6 includes the first interface extension circuit 31, the main control circuit 40 and the plurality of encoder circuits 21, and further includes a second interface extension circuit 32 and a plurality of key circuits 22. Each of the key circuits 22 is configured to output a signal with a third voltage level when the key circuit is triggered (e.g., triggered by a touch operation or a pressing operation); and to output a signal with a fourth voltage level when the key circuit is not triggered. The third voltage level is different from the fourth voltage level.

Figure 7:
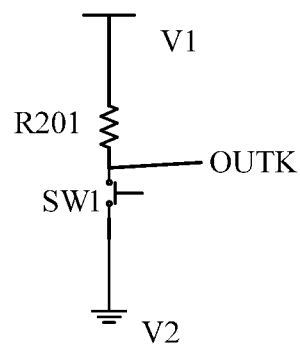
FIG. 7 is a schematic diagram showing a key circuit provided in an embodiment of the present disclosure.

FIG. 7 is a schematic diagram showing a key circuit provided in an embodiment of the present disclosure. As shown in FIG. 7, the key circuit 22 includes a pull-up resistor R201 and a push switch SW1. Both terminals of the pull-up resistor R201 are respectively coupled to the first power terminal V1 and an output terminal OUTK of the key circuit 22. Both terminals of the key switch SW1 are coupled to the second power terminal V2 and the output terminal OUTK of the key circuit 22, respectively. The key switch SW1 is turned on when the key switch SW1 is triggered by a touch operation, and the key switch SW1 is turned off when no touch operation or pressing operation is performed on the key switch SW1. The third voltage level is a voltage level of the output terminal OUTK of the key circuit 22 when the key switch SW1 is turned on; the fourth voltage level is a voltage level of the output terminal OUTK of the key circuit 22 when the key switch SW1 is turned off.

Figure 8:
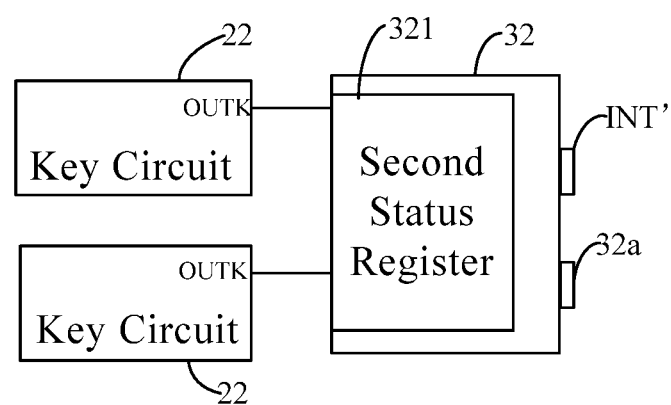
FIG. 8 is a schematic diagram showing a connection between a second interface extension circuit and a key circuit provided in some embodiments of the present disclosure.

FIG. 8 is a schematic diagram showing a connection between the second interface extension circuit and the key circuit provided in some embodiments of the present disclosure, and the number of the key circuits 22 in FIG. 8 is only an exemplary illustration. As shown in FIG. 8, the second interface extension circuit 32 includes a second status register 321. In some embodiments, the output terminal OUTK of each key circuit 22 is coupled to one input interface, for example, a GPIO interface, of the second interface extension circuit 32.

The second status register 321 is coupled to each input interface of the second interface extension circuit 32. The second status register 321 is configured to generate and store triggering state data for each key circuit 22 according to an output signal of the key circuit 220. When any one of the key circuits 22 is triggered, the second status register 321 provides an interrupt signal to an interrupt terminal INT' of the second interface extension circuit 32, so that the interrupt signal is output through the interrupt terminal INT' of the second interface extension circuit 32. Triggering state data for the key circuit 22 indicates whether the key circuit 22 is triggered. For example, digital signal "1" indicates that the key circuit 22 is triggered, and digital signal "0" indicates that the key circuit 22 is not triggered.

The main control circuit 40 is further configured to determine the number of the triggered key circuit 22 according to the triggering state data of each key circuit 22 stored in the second status register 321, when the interrupt signal is output through the interrupt terminal INT' of the second interface extension circuit 32.

For example, the main control circuit 40 includes the first interrupt receiving interface 40a, the first signal reading interface 40b, a second interrupt receiving interface 40d, and a second signal reading interface 40e. The first interrupt receiving interface 40a is coupled to the interrupt terminal INT of the first interface extension circuit 31 and configured to receive the interrupt signal output from the first interface extension circuit 31. The first signal reading interface 40b is configured to read the voltage state transition data for the first output terminal OUT1 and the second output terminal OUT2 stored in the first status register 311. The second interrupt receiving interface 40d is coupled to the interrupt terminal INT' of the second interface extension circuit 32 and configured to receive the interrupt signal output from the second interface extension circuit 32. The second signal reading interface 40e is coupled to a data terminal 32a of the second interface extension circuit 32 and configured to read the data stored in the second status register 321 through the data terminal 32a. When receiving the interrupt signal, the main control circuit 40 determines whether the interrupt signal comes from the first interface extension circuit 31 or from the second interface extension circuit 32, and if it is determined that the interrupt signal comes from the first interface extension circuit 31, the main control circuit 40 determines which encoder circuit 21 is triggered by the rotation operation and the rotation direction according to the above-mentioned method I or method II; if it is determined that the interrupt signal comes from the second interface extension circuit 32, the main control circuit 40 determines which key circuit 22 is triggered by a touch operation or pressing operation according to the triggering state data for each key circuit 22 stored in the second status register 321.

As shown in FIG. 6, the key control device further includes a first indication structure 71 and a second indication structure 72. The first indication structure 71 is coupled to the main control circuit 40 and configured to output a corresponding indication signal according to the number, determined by the main control circuit 40, of the encoder circuit 21 triggered by the rotation operation. For example, the first indication structure 71 includes a plurality of first indication elements, which are in one-to-one correspondence with the encoder circuits 21. When the main control circuit 40 determines that one of the encoder circuits 21 is triggered by the rotation operation, the main control circuit 40 controls an indication element corresponding to the encoder circuit 21 to output an indication signal.

The second indication structure 72 is coupled to the main control circuit 40 and configured to output a corresponding indication signal according to the number of the triggered key circuit 22. The number of the triggered key circuit 22 is determined by the main control circuit 40. For example, the second indication structure 72 includes a plurality of second indication elements that are in one-to-one correspondence with the encoder circuits 21. When the main control circuit 40 determines that one of the key circuits 22 is triggered, the main control circuit 40 controls an indication element corresponding to the key circuit 22 to output an indication signal.

The indication signal includes at least one of a light signal, a sound signal and a vibration signal. In an example, each of the first and second indication elements each employs a light emitting diode.

FIG. 9 is a schematic diagram showing an electronic device provided in some embodiments of the present disclosure, the electronic device is particularly suitable for a monitor device. The electronic device includes a system circuit board 11 and the key control device according to any one of above embodiments. The system circuit board 11 communicates with the main control circuit 40. The main control circuit 40 outputs an operation control command to the system circuit board 11 according to the determined result (e.g., the number and the rotation direction of the rotary encoder triggered by the rotation operation, or the number of the triggered key circuit), and the system circuit board 11 performs a corresponding operation according to the operation control command output from the main control circuit 40.

FIG. 10 is a flowchart showing a key control method provided in some embodiments of the present disclosure. The key control method is applied to the key control device provided in the above embodiments. As shown in FIG. 2 to FIG. 8, the key control device includes the first interface extension circuit 31, the main control circuit 40 and the encoder circuits 21. The encoder circuit 21 is configured to output the first voltage signal and the second voltage signal through the first output terminal INT1 and the second output terminal INT2 respectively, upon triggering of the rotation operation. Each of the first voltage signal and the second voltage signal has two voltage states, and the voltage state refers to a voltage state of the first voltage signal or the second voltage signal. For example, under the triggering of the rotation operation, each of the first voltage signal and the second voltage signal switches between the first voltage state and the second voltage state. That is, each of the first output terminal OUT1 and the second output terminal OUT2 switches between the first voltage state and the second voltage state. When the rotation direction is clockwise, the transition of the voltage state of the first voltage signal occurs prior to the transition of the voltage state of the second voltage signal; when the rotation direction is counterclockwise, the transition of the voltage state of the second voltage signal occurs prior to the transition of the voltage state of the first voltage signal.

The key control method includes steps S11 and S12.

At step S11, the first interface extension circuit 31 receives the first voltage signal and the second voltage signal, and generates an interrupt signal and voltage state transition data in response to the first voltage signal or the second voltage signal output by the encoder circuit 21. The voltage state transition data indicates whether a transition of the voltage state occurs.

In some embodiments, the first interface extension circuit 31 includes a first status register 311. The generation, by the first interface extension circuit 31, of the voltage state transition data specifically includes:

generating and storing, by the first status register 311, the voltage state transition data for the first output terminal and the second output terminal of the encoder circuit according to the first voltage signal and/or the second voltage signal.

The generation, by the first interface extension circuit 31, of the interrupt signal may specifically include: outputting the interrupt signal through the interrupt terminal of the first interface extension circuit 31, when a voltage state of the first voltage signal of the first output terminal OUT1 transitions or a voltage state of the second voltage signal of the second output terminal OUT2 transitions.

At step S12, the main control circuit 40 determines the rotation direction of the rotation operation according to the interrupt signal and the voltage state transition data.

In some embodiments, step S12 includes: reading out, by the main control circuit 40, the voltage state transition data stored in the first status register 311 in response to the interrupt signal output by the first interface extension circuit 31, and determining the rotation direction of the rotation operation according to at least the voltage state transition data stored in the first status register 311.

In some embodiments, the key control device includes a plurality of encoder circuits 21. The key control method further includes: determining, by the main control circuit 40, the number of encoder circuit triggered by the rotation operation based on the interrupt signal and the voltage state transition data.

Figure 11:
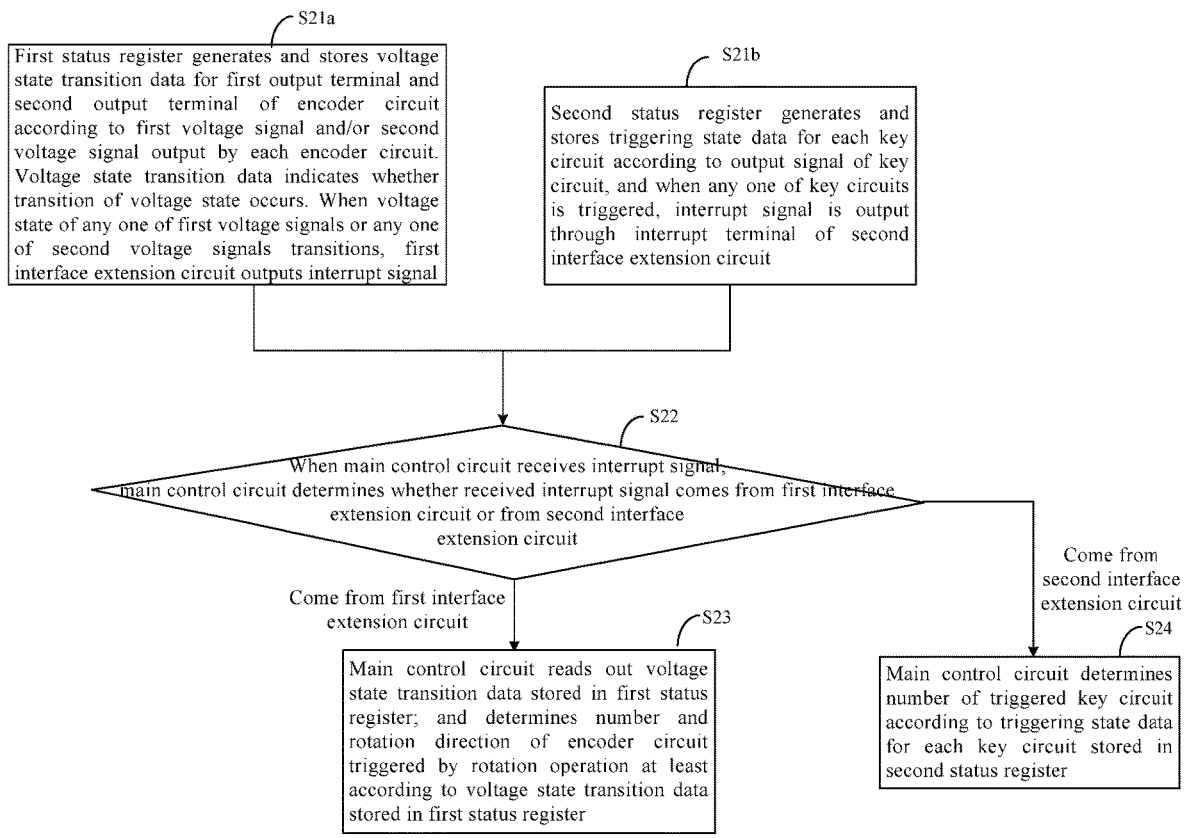
FIG. 11 is a flowchart showing a key control method provided in further embodiments of the present disclosure.

FIG. 11 is a flowchart showing a key control method provided in another embodiment of the present disclosure. The method shown in FIG. 11 is applied to the structure shown in FIG. 6. As shown in FIG. 6, the key circuit board further includes the second interface extension circuit 32, the plurality of key circuits 22, the first indication structure 71 and the second indication structure 72. The second interface extension circuit 32 includes the second status register 321 as shown in FIG. 8. The key circuit 22 is configured to output a signal with a third voltage level when the key circuit 22 is triggered; otherwise, to output a signal with a fourth voltage level.

As shown in FIG. 11, the key control method includes steps S21a to S24.

At step S21a, the first status register 311 generates and stores the voltage state transition data for the first output terminal and the second output terminal of each encoder circuit 21 according to the first voltage signal and/or the second voltage signal output by the encoder circuit 21. The voltage state transition data indicates whether a transition of the voltage state occurs. When the voltage state of any one of the first voltage signals or any one of the second voltage signals transitions, the first interface extension circuit 31 outputs an interrupt signal.

At step S21b, the second status register 321 generates and stores the triggering state data for each key circuit 22 according to the output signal of the key circuit 22; and when any one of the key circuits 22 is triggered, the interrupt signal is output through the interrupt terminal of the second interface extension circuit 32.

At step S22, when the main control circuit 40 receives the interrupt signal, the main control circuit 40 determines whether the received interrupt signal comes from the first interface extension circuit 31 or from the second interface extension circuit 32. When the interrupt signal comes from the first interface extension circuit 31, the step S23 is executed; when the interrupt signal comes from the second interface extension circuit 32, step S24 is executed.

At step S23, the main control circuit 40 reads out the voltage state transition data stored in the first status register 311; and determines the number and the rotation direction of the encoder circuit 21 triggered by the rotation operation at least according to the voltage state transition data stored in the first status register 311.

In some alternative implementations, step S23 includes: waiting for, by the main control circuit 40, the interrupt signal output by the first interface extension circuit 31 for the $(i+1)^{th}$ time, if the interrupt signal currently received by the main control circuit 40 is an interrupt signal output by the first interface extension circuit 31 for the $i^{th}$ time where i is an odd number; and determining the rotation direction, according to the voltage state transition data for each of the first output terminal and the second output terminal when the first interface extension circuit 31 outputs the interrupt signals for the $i^{th}$ time and for the $(i+1)^{th}$ time. For example, the main control circuit 40 determines a transition timing of the voltage states for the first output terminal OUT1 and the second output terminal OUT2, according to the voltage transition data for the first output terminal OUT1 and the second output terminal OUT2 when the first interface extension circuit 31 outputs the interrupt signals for the $i^{th}$ time and for the $(i+1)^{th}$ time, and determines the rotation direction, according to the transition timing of the voltage states for the first output terminal OUT1 and the second output terminal OUT2.

The specific process for determining the rotation direction by the main control circuit 40 according to the transition timing of the voltage states for the first output terminal and the second output terminal is described above for reference, which will not be described herein again.

When the main control circuit 40 determines that one of the encoder circuits 21 is triggered by the rotation operation, the main control circuit 40 controls the first indication structure to output a corresponding indication signal according to the number of the triggered encoder circuit 21.

At step S24, the main control circuit 40 determines the number of the triggered key circuit 22 according to the triggering state data for each key circuit 22 stored in the second status register 321.

When the main control circuit 40 determines that one of the key circuits 22 is triggered, the main control circuit 40 controls the second indication structure to output a corresponding indication signal according to the number of the triggered key circuit 22.

Figure 12:
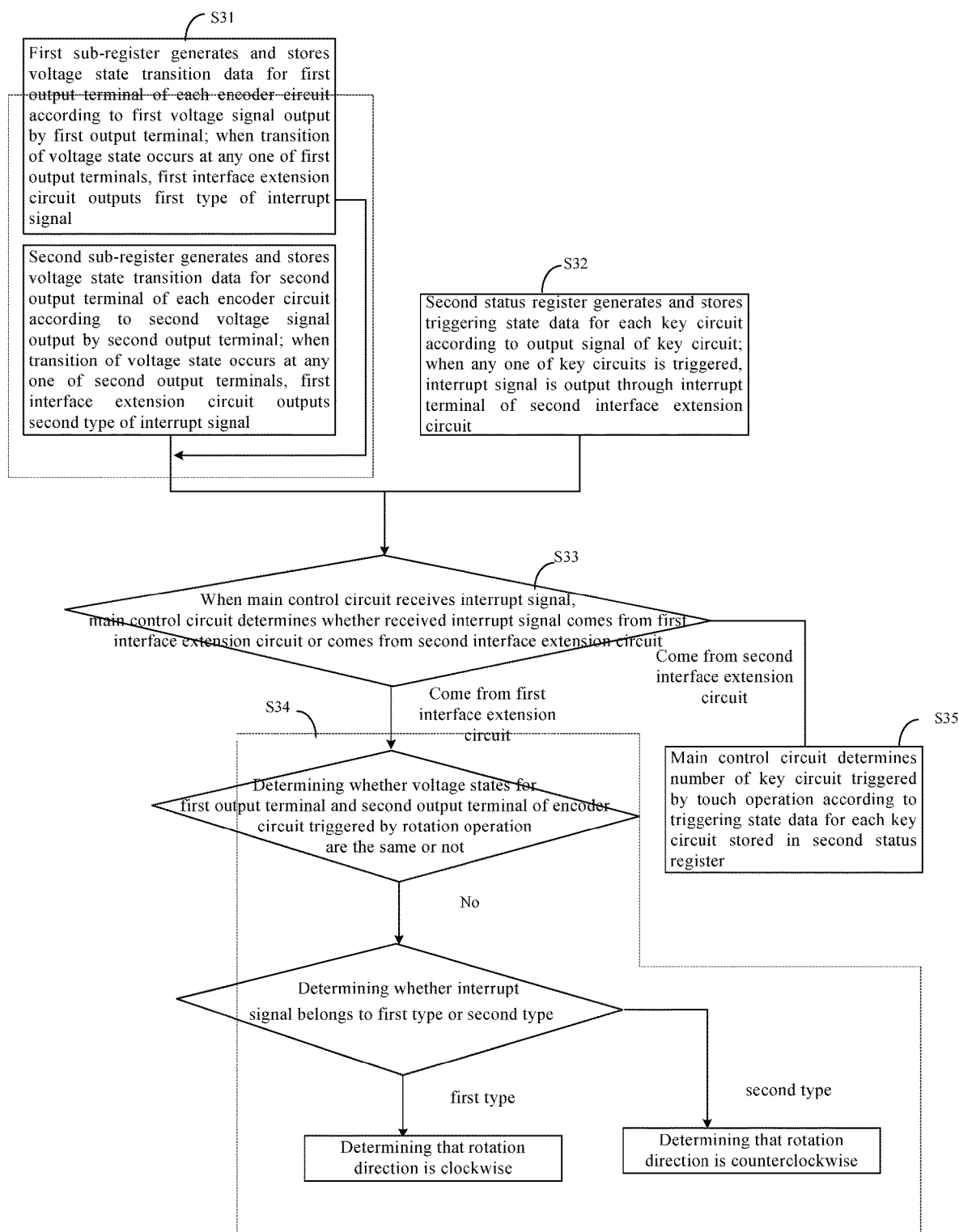
FIG. 12 is a flowchart showing a key control method provided in further embodiments of the present disclosure.

FIG. 12 is a flowchart showing a key control method provided in further embodiments of the present disclosure. The method shown in FIG. 12 is applied to the structure shown in FIG. 6. The first interface extension circuit 31 adopts the structure shown in FIG. 5. The first status register 311 includes the first sub-register 3111 and the second sub-register 3112. In addition, the first interface extension circuit 31 further includes the voltage level register 312.

As shown in FIG. 12, the key control method includes steps S31 to S34.

At step S31, the first status register 311 generates and stores the voltage state transition data for the first output terminal and the second output terminal of each encoder circuit 21 according to the first voltage signal and/or the second voltage signal output by the encoder circuit 21. When a transition of a voltage state occurs at any one of the first output terminals or any one of the second output terminals, the first interface extension circuit 31 outputs an interrupt signal.

Specifically, at step S31, the first sub-register 311 generates and stores the voltage state transition data for the first output terminal of each encoder circuit 21 according to the first voltage signal output by the first output terminal. When a transition of the voltage state occurs at any one of the first output terminals, the first interface extension circuit 31 outputs a first type of interrupt signal. The second sub-register 3112 generates and stores the voltage state transition data for the second output terminal of each encoder circuit 21 according to the second voltage signal output by the second output terminal. When a transition of the voltage state occurs at any one of the second output terminals, the first interface extension circuit 31 outputs a second type of interrupt signal.

In some embodiments, the interrupt terminal of the first interface extension circuit 31 includes the first interrupt terminal INT1 and the second interrupt terminal INT2. The first type of interrupt signal is an interrupt signal output from the first interrupt terminal INT1, and the second type of interrupt signal is an interrupt signal output from the second interrupt terminal INT2.

At step S32, the second status register 321 generates and stores the triggering state data for each key circuit 22 according to the output signal of the key circuit 22. When any one of the key circuits 22 is triggered, an interrupt signal is output through the interrupt terminal of the second interface extension circuit 32.

At step S33, when the main control circuit 40 receives the interrupt signal, the main control circuit 40 determines whether the received interrupt signal comes from the first interface extension circuit 31 or comes from the second interface extension circuit 32. When the interrupt signal comes from the first interface extension circuit 31, the step S34 is executed; and when the interrupt signal comes from the second interface extension circuit 32, step S35 is executed.

At step S34, the main control circuit 40 determines the number and the rotation direction of the encoder circuit 21 triggered by the rotation operation according to at least the voltage state transition data stored in the first status register 311.

Specifically, step S34 includes: determining whether the voltage states for the first output terminal and the second output terminal of the encoder circuit 21 triggered by the rotation operation are the same or not, according to the voltage states obtained by the voltage level register 312; if not, determining whether the interrupt signal belongs to the first type or the second type of interrupt signal; and if the interrupt signal belongs to the first type of interrupt signal, determining that the rotation direction is clockwise; and if the interrupt signal belongs to the second type of interrupt signal, determining that the rotation direction is counterclockwise.

When the main control circuit 40 determines that one of the encoder circuits 21 is triggered by the rotation operation, the main control circuit 40 may control the first indication structure to output a corresponding indication signal according to the number of the triggered encoder circuit 21.

At step S35, the main control circuit 40 determines the number of the triggered key circuit 22 according to the triggering state data for each key circuit 22 stored in the second status register 321.

When the main control circuit 40 determines that one of the key circuits 22 is triggered, the main control circuit 40 may control the second indication structure to output a corresponding indication signal according to the number of the triggered key circuit 22.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and essence of the present disclosure, and these changes and modifications are to be considered within the scope of the present disclosure.

What is claimed is:

1. A key control device, comprising:
an encoder circuit comprising a first output terminal and a second output terminal and configured to output a first voltage signal and a second voltage signal through the first output terminal and the second output terminal respectively, under triggering of a rotational operation;
a first interface extension circuit configured to receive the first voltage signal and the second voltage signal, and generate an interrupt signal and voltage state transition data in response to the first voltage signal or the second voltage signal output by the encoder circuit; and
a main control circuit configured to determine a rotation direction of the rotation operation according to the interrupt signal and the voltage state transition data,
wherein the first interface extension circuit comprises a first status register configured to generate and store the voltage state transition data for the first output terminal and the second output terminal of the encoder circuit based on the first voltage signal and/or the second voltage signal,
wherein the main control circuit is configured to read out the voltage state transition data stored in the first status register in response to the interrupt signal output from the first interface extension circuit, and to determine the rotation direction of the rotation operation based on at least the voltage state transition data stored in the first status register,
the first status register comprises a first sub-register and a second sub-register,
the first sub-register is configured to generate and store the voltage state transition data for the first output terminal of the encoder circuit according to the first voltage signal output by the first output terminal,
the first interface extension circuit is configured to output a first type of interrupt signal when a transition of a voltage state occurs at the first output terminal,
the second sub-register is configured to generate and store the voltage state transition data for the second output terminal of the encoder circuit according to the second voltage signal output by the second output terminal, and
the first interface extension circuit is configured to output a second type of interrupt signal when a transition of a voltage state occurs at the second output terminal.

2. The key control device of claim 1, wherein the first interface extension circuit comprises a first interrupt terminal and a second interrupt terminal; the first type of interrupt signal being an interrupt signal output by the first interrupt terminal, and the second type of interrupt signal being an interrupt signal output by the second interrupt terminal.

3. The key control device of claim 1, wherein
the first interface extension circuit further comprises: a voltage level register configured to acquire voltage states for the first output terminal and the second output terminal of the encoder circuit in real time, and
determining the rotation direction of the rotation operation based on at least the voltage state transition data stored in the first status register comprises:
determining whether the voltage states for the first output terminal and the second output terminal of the encoder circuit triggered by the rotation operation are the same, according to the voltage states acquired by the voltage level register;
determining whether the interrupt signal is the first type of interrupt signal or the second type of interrupt signal in response to that the voltage states for the first output terminal and the second output terminal of the encoder circuit triggered by the rotation operation are not the same;
determining that the rotation direction is clockwise in response to that the interrupt signal is the first type of interrupt signal, and
determining that the rotation direction is counterclockwise in response to that the interrupt signal is the second type of interrupt signal.

4. The key control device of claim 1, wherein the main control circuit is configured to:
wait for an interrupt signal output by the first interface extension circuit for an $(i+1)^{th}$ time when the main control circuit receives an interrupt signal output by the first interface extension circuit for an $i^{th}$ time, and
determine the rotation direction, according to the voltage state transition data for the first output terminal and the second output terminal when the first interface extension circuit outputs the interrupt signals for the $i^{th}$ time and for the $(i+1)^{th}$ time; wherein i is an odd number.

5. The key control device of claim 1, comprising a plurality of encoder circuits, wherein
the main control circuit is further configured to determine a number of an encoder circuit triggered by the rotation operation based on the interrupt signal and the voltage state transition data.

6. The key control device of claim 1, further comprising:
a plurality of key circuits each configured to output a signal with a third voltage level when the key circuit is triggered; otherwise, to output a signal with a fourth voltage level; and
a second interface extension circuit comprising a second status register configured to generate and store triggering state data for each of the plurality of key circuits according to the signal output by the key circuit; the second interface extension circuit being configured to output an interrupt signal through an interrupt terminal of the second interface extension circuit when any one of the plurality of key circuits is triggered, wherein the main control circuit is further configured to determine a number of the triggered key circuit according to the triggering state data for each of the plurality of key circuits stored in the second status register when the second interface extension circuit outputs the interrupt signal.

7. A key control method for a key control device, the key control device comprising: a first interface extension circuit, a main control circuit and an encoder circuit, and the encoder circuit comprising a first output terminal and a second output terminal and configured to output a first voltage signal and a second voltage signal through the first output terminal and the second output terminal under triggering of a rotation operation; wherein the key control method comprises:

receiving, by the first interface extension circuit, the first voltage signal and the second voltage signal, and generating, by the first interface extension circuit, an interrupt signal and voltage state transition data in response to the first voltage signal or the second voltage signal output by the encoder circuit, and determining, by the main control circuit, a rotation direction of the rotation operation according to the interrupt signal and the voltage state transition data, wherein the first interface extension circuit comprises a first status register, and generating, by the first interface extension circuit, the voltage state transition data, comprises: generating and storing, by the first status register, the voltage state transition data for the first output terminal and the second output terminal of the encoder circuit based on the first voltage signal and/or the second voltage signal, determining, by the main control circuit, the rotation direction of the rotation operation according to the interrupt signal and the voltage state transition data comprises: reading out, by the main control circuit, the voltage state transition data stored in the first status register in response to the interrupt signal output from the first interface extension circuit, and determining the rotation direction of the rotation operation based on at least the voltage state transition data stored in the first status register, the first status register comprises a first sub-register and a second sub-register, and generating and storing, by the first status register, the voltage state transition data for the first output terminal and the second output terminal of the encoder circuit based on the first voltage signal and/or the second voltage signal, comprises: generating and storing, by the first sub-register, the voltage state transition data for the first output terminal of the encoder circuit according to the first voltage signal output by the first output terminal, and generating and storing, by the second sub-register, the voltage state transition data for the second output terminal of the encoder circuit according to the second voltage signal output by the second output terminal, and the first interface extension circuit outputs a first type of interrupt signal when a transition of a voltage state occurs at the first output terminal; and the first interface extension circuit outputs a second type of interrupt signal when a transition of a voltage state occurs at the second output terminal.

8. The key control method of claim 7, wherein the first interface extension circuit comprises a first interrupt terminal and a second interrupt terminal, the first type of interrupt signal being an interrupt signal output by the first interrupt terminal, and the second type of interrupt signal being an interrupt signal output by the second interrupt terminal.

9. The key control method of claim 7, wherein the first interface extension circuit further comprises a voltage level register, and the key control method further comprises: acquiring, by the voltage level register, voltage states for the first output terminal and the second output terminal of the encoder circuit in real time;

determining the rotation direction of the rotation operation based on at least the voltage state transition data stored in the first status register, comprises:

determining whether the voltage states for the first output terminal and the second output terminal of the encoder circuit triggered by the rotation operation are the same according to the voltage states acquired by the voltage level register;

determining whether the interrupt signal is the first type of interrupt signal or the second type of interrupt signal in response to that the voltage states for the first output terminal and the second output terminal of the encoder circuit triggered by the rotation operation are not the same; and determining that the rotation direction is clockwise in response to that the interrupt signal is the first type of interrupt signal; and determining that the rotation direction is counterclockwise in response to that the interrupt signal is the second type of interrupt signal.

10. The key control method of claim 7, wherein reading out, by the main control circuit, the voltage state transition data stored in the first status register in response to the interrupt signal output from the first interface extension circuit, and determining the rotation direction of the rotation operation based on at least the voltage state transition data stored in the first status register, comprises:

waiting for an interrupt signal output by the first interface extension circuit for an $(i+1)^{th}$ time when the main control circuit receives an interrupt signal output by the first interface extension circuit for an $i^{th}$ time, and determining the rotation direction, according to the voltage state transition data for each of the first output terminal and the second output terminal when the first interface extension circuit outputs the interrupt signals for the $i^{th}$ time and for the $(i+1)^{th}$ time; wherein i is an odd number.

11. The key control method of claim 7, wherein the key control device comprises a plurality of encoder circuits, and the key control method further comprises: determining, by the main control circuit, a number of an encoder circuit triggered by the rotation operation based on the interrupt signal and the voltage state transition data.

12. The key control method of claim 7, wherein the key control device further comprises: a second interface extension circuit having a second status register and a plurality of key circuits each configured to output a signal with a third voltage level when the key circuit is triggered; otherwise, to output a signal with a fourth voltage level;

the key control method further comprises:
generating and storing, by the second status register, triggering state data for each of the plurality of key circuits according to the signal output by the key circuit,
outputting, by the second interface extension circuit, an interrupt signal through an interrupt terminal of the second interface extension circuit when any one of the plurality of key circuits is triggered, and
determining, by the main control circuit, a number of the triggered key circuit according to the triggering state data for each of the plurality of key circuits stored in the second status register when the main control circuit receives the interrupt signal output by the second interface extension circuit.

* * * * *